United States Patent [19]

Karlin et al.

[11] 4,266,189

[45] May 5, 1981

[54] CURRENT MEASURING APPARATUS AND METHOD

[75] Inventors: Richard A. Karlin; Robert W. McDonald, both of Chicago; Gary F. Comiskey, Evanston, all of Ill.

[73] Assignee: Sun Electric Corporation, Crystal Lake, Ill.

[21] Appl. No.: 709,458

[22] Filed: Jul. 28, 1976

[51] Int. Cl.³ .................. G01R 19/00; G01R 1/30; G01R 31/00
[52] U.S. Cl. .......................... 324/117 H; 324/123 R; 324/158 MG
[58] Field of Search ............. 324/117 H, 117 R, 45, 324/158 MG, 123 R, 73 R, 158 R, 251, 127

[56] References Cited

U.S. PATENT DOCUMENTS

| | | | |
|---|---|---|---|
| 2,836,791 | 5/1958 | Kaplan | 324/117 R |
| 2,886,779 | 5/1959 | Kuhrt et al. | 324/117 H |
| 3,219,909 | 11/1965 | Foster | 324/45 |
| 3,219,930 | 11/1965 | Sipler | 324/45 |
| 3,238,370 | 3/1966 | Leeds, Jr. | 324/45 |
| 3,311,826 | 3/1967 | Galman | 324/123 R |
| 3,594,642 | 7/1971 | Wright | 324/73 R |
| 3,629,704 | 12/1971 | Stevens | 324/158 MG |
| 4,059,798 | 11/1977 | Dierker et al. | 324/251 |

OTHER PUBLICATIONS

Shirer, D. L.; "Pulsing Hall Probes . . . "; Rev. of Sci. Instruments; vol. 31; No. 9, Sep. 1960; pp. 1000–1001.
Catalog B-703; Kepco, Inc., Flushing, N. Y. 11352; pp. 7 & 62; 1970.

*Primary Examiner*—Ernest F. Karlsen
*Attorney, Agent, or Firm*—Allegretti, Newitt, Witcoff & McAndrews

[57] ABSTRACT

The disclosure describes an improved apparatus for measuring the flow of current through a conductor by means of a Hall generator. The Hall generator is biased by a constant current source employing feedback. In order to increase the accuracy of the current measurement, operational amplifiers having inputs which float in relationship to the power supply operating the amplifiers are used to amplify the Hall generator output voltage and to drive a meter. The current measuring apparatus can be used to detect defects in a vehicular alternator by measuring the fluctuating components of the alternator output current. The magnetic field generated by the current to be measured is concentrated in the area of the Hall generator by means of a unique hollow, cylindrical, coiled strip of metal made from nickel, molybdenum and iron. The apparatus includes a regulator in which the voltage drop is so low that a 3.25 volt regulated supply can be maintained from a poorly-charged 6-volt battery.

25 Claims, 9 Drawing Figures

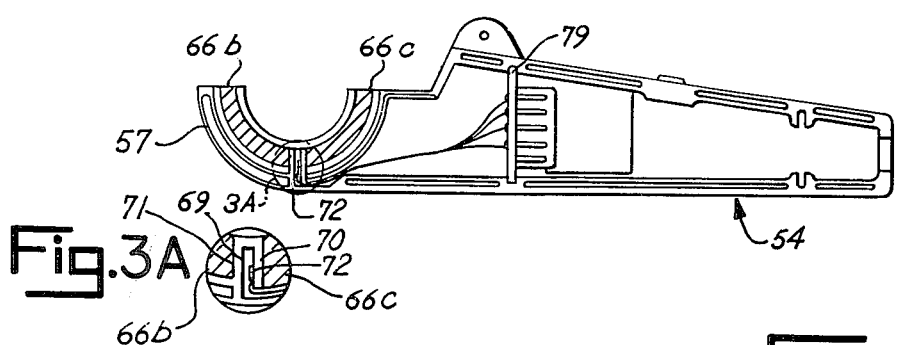
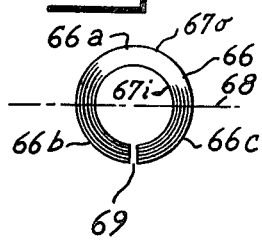
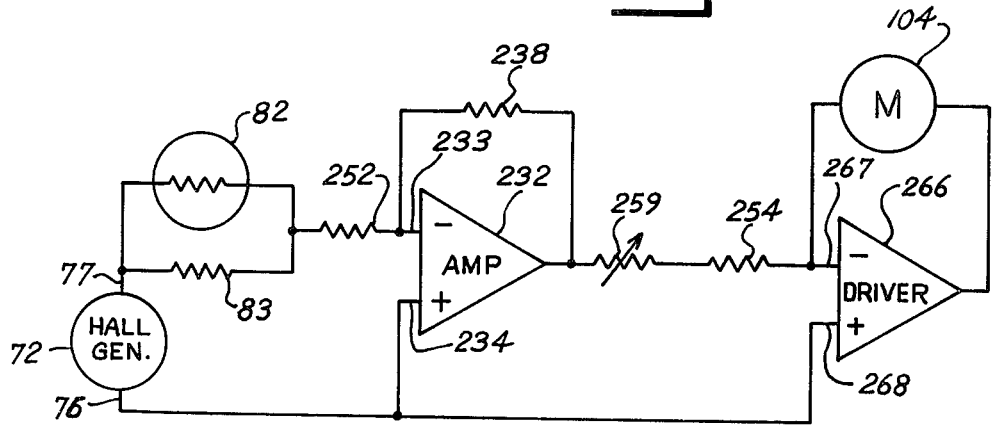
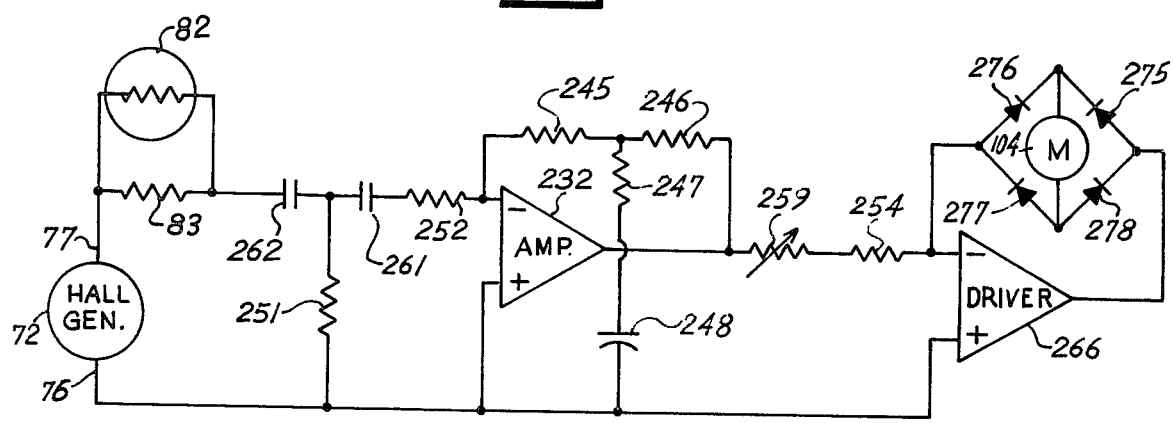

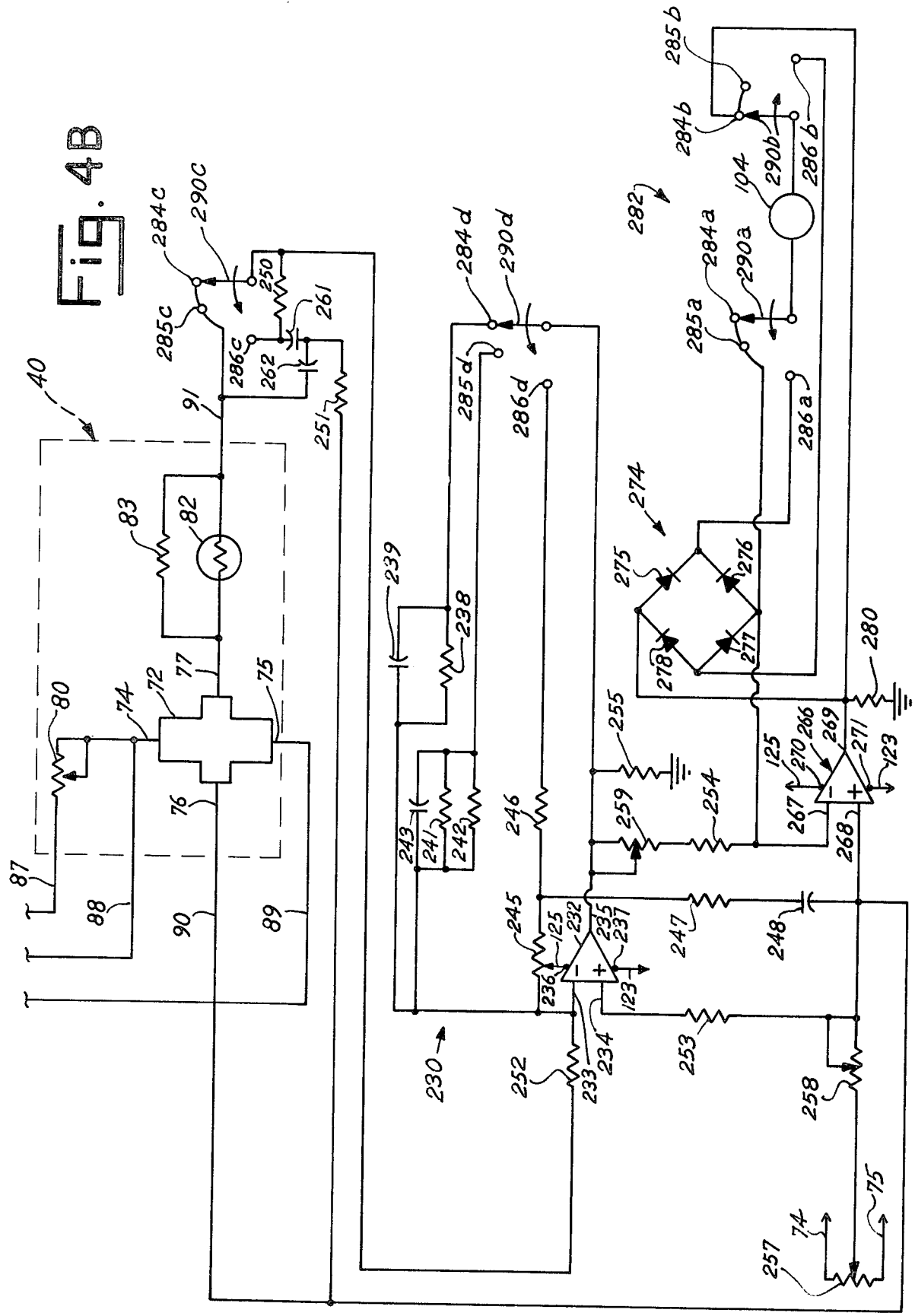

CURRENT MEASURING APPARATUS AND METHOD

BACKGROUND AND SUMMARY OF THE INVENTION

This invention relates to current measuring techniques, and more particularly relates to current measuring techniques employing a Hall generator.

Hall generators for measuring the current carried through a conductor have been known in the past. However, the accuracy of such devices has suffered in the past due to inadequate regulating, current biasing and readout circuits associated with the Hall generator. Although coiled metal strips having the configuration described herein have been used in the past in connection with Hall generators, the fabrication of the coils from silicon steel has limited their usefulness.

Accordingly, it is an object of the present invention to provide an improved constant current circuit for biasing a Hall generator by means of a sample voltage proportional to the current flowing through the Hall generator, a reference voltage, and means for comparing the reference and sample voltages.

Another object of the invention is to provide a bias circuit of the foregoing type in which the Hall generator and an adjustable portion of the circuit are held within a probe which can be placed around the conductor carrying the current to be measured, and in which the remaining portion of the bias circuit is contained in a separate cabinet connected to the probe through a cable, so that Hall generators with different characteristics can be adjusted to work interchangeably with like bias circuits.

Still another object of the present invention is to provide a readout for the Hall generator in which the Hall output voltage is conducted to the inputs of at least one operational amplifier which floats in relationship to the power supply operating the amplifier.

Yet another object of the present invention is to provide a readout circuit of the foregoing type in which a meter for indicating the current to be measured is connected in the feedback loop of an operational amplifier having inputs adapted to receive the Hall voltage.

Another object of the invention is to provide a method of detecting defects in a vehicular alternator by measuring the fluctuating current produced by the alternator.

Still another object of the present invention is to provide a method of the foregoing type in which the fluctuating current is attenuated below a predetermined frequency.

Yet another object of the present invention is to provide a probe of the foregoing type in which the magnetic field produced by the current to be measured is concentrated in the area adjacent the Hall generator by means of a toroidal, laminated core comprising nickel and iron.

Another object of the invention is to provide an improved regulator in which the voltage drop is sufficiently low to enable operation from a partially discharged vehicular battery.

DESCRIPTION OF THE DRAWINGS

These and other objects and features of the present invention will hereafter appear in connection with the accompanying drawings in which like numbers refer to like parts throughout, and in which:

FIG. 3 is a cross-sectional, fragmentary view of a portion of the probe shown in FIG. 1;

FIG. 3A is an enlarged, fragmentary elevational view of the circled portion of FIG. 3;

FIG. 3B is a side elevation of the strip metal coil forming a part of the probe shown in FIG. 1;

FIGS. 4A and 4B are electrical schematic drawings of a preferred form of circuitry made in accordance with the present invention;

FIG. 5 is an equivalent circuit showing the components which are connected when the switch shown in FIG. 4B is moved to the DC current measuring positions 284 or 285; and FIG. 6 is an equivalent circuit illustrating the components connected together when the switch shown in FIG. 4B is moved to the fluctuating current measuring position 286.

DESCRIPTION OF THE PREFERRED EMBODIMENT

Figure 2:
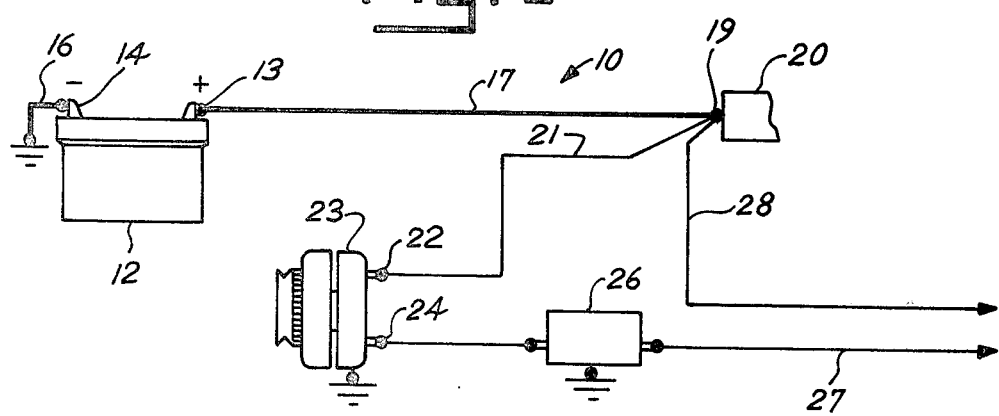
FIG. 2 is a schematic drawing of a typical vehicular AC charging system employing an alternator which generates current that can be measured by the apparatus of the present invention.

FIG. 2 illustrates a typical vehicular charging system 10 which generates current that can be measured by the preferred embodiment of the invention. System 10 includes a rechargeable lead-storage battery 12 having a positive terminal 13, a negative terminal 14 and a ground cable 16 that is connected to the chassis of the vehicle. Battery 12 is a conventional lead-acid battery which is typically used to provide a starting current for automobiles.

Battery 12 is charged by current carried through a charging conductor 17 which is attached to a terminal 19 of a starter switch 20. The current also is carried through a conductor 21 connected to the output terminal 22 of an alternator 23. The alternator is a conventional AC generator which includes rectifying diodes in order to produce a three-phase rectified DC current. The amount of current produced at terminal 22 is determined by the amount of current flowing into a field winding terminal 24 from a voltage regulator 26. A voltage is received by voltage regulator 26 from the battery through an ignition switch (not shown) and a conductor 27. A conductor 28 provides a DC current to the various portions of the vehicle, such as the lights, ignition system and accessories (not shown).

Figure 1:
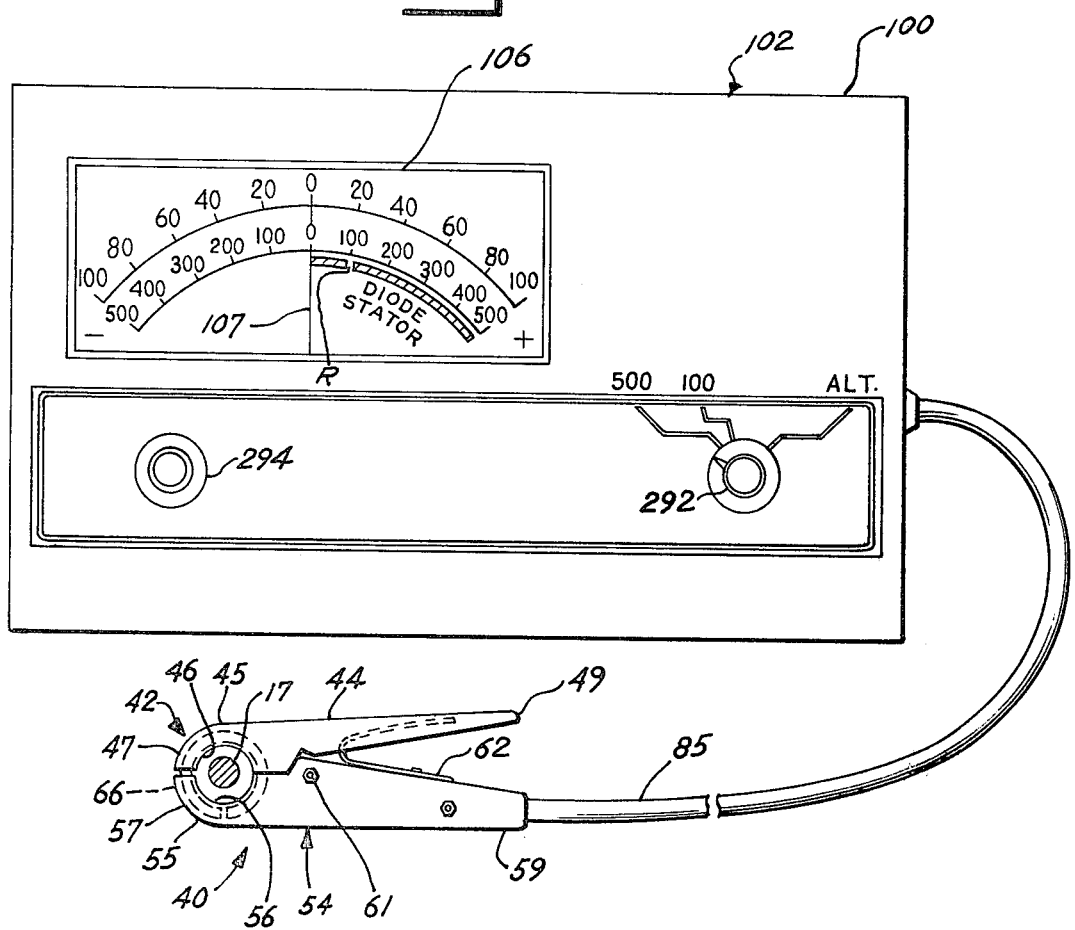
FIG. 1 is a schematic drawing illustrating a preferred form of cabinet, meter and probe made in accordance with the present invention.

As shown in FIG. 1, a preferred form of the present invention basically comprises a probe assembly 40 and a circuit system 100 held in a cabinet 102. The cabinet and probe are connected by a cable 85.

More specifically, referring to FIGS. 1 and 3, probe assembly 40 comprises a clamp 42 including an upper member 44 having a semi-circular jaw 45 with an inside diameter 46 and an outside diameter 47. The upper member also includes a handle 49. Clamp 42 further comprises a lower member 54 having a semi-circular jaw 55 with an inside diameter 56 and an outside diameter 57. A handle 59 cooperates with handle 49 to allow the jaws to be opened and closed by rotating them around a pivot axis 61. The jaws normally are biased in the closed position shown in FIG. 1 by means of a spring 62. Upper and lower jaws 45 and 55 hold a toroidal, laminated core fabricated in the form of a hollow, cylindrical, coiled strip of metal 66 having an inner convolution 67i and an outer convolution 67o. Referring to FIG. 3B, the strip of metal is wound around a circular mandrel (not shown) having a diameter as large as convolution 67i so that the strip takes the form of a ring. Electrically insulating adhesive is applied to the strip as it is wound on the mandrel. After baking, the adhesive holds the parts together and insulates the convolutions which form the lamina of the coil. After the strip is coiled and baked, it is cut in half along a diameter 68, and a radial slot 69 is formed. The cutting operation divides coil 66 into an upper semicircular segment 66a and two lower segments 66b and 66c. After coil 66 is cut along diameter 68, upper segment 66a is placed in jaw 45 and lower segments 66b, 66c of the coil are placed in jaw 55. As shown in FIG. 3A, plastic spacers 70, 71 maintain the proper spacing of slot 69.

Spring 62 normally biases the upper and lower segments of the coil together, so that the segments touch each other on both sides, as shown in FIG. 1. When handles 49 and 59 are moved together, the upper and lower segments of coil 66 move apart so that a current-carrying conductor, such as conductor 17, can be conveniently moved inside the coil.

Coil 66 is made from Mollypermalloy which contains approximately 79 percent nickel, 17 percent molybdenum, and the balance iron. The coil is hydrogen annealed to provide a very round hysteresis loop. The purpose of the annealing is to provide minimum hysteresis. Hysteresis would cause the coiled strip to retain some of the magnetic field to which it had been previously exposed. Thus, any exposure to a strong field would leave a residual magnetism which would give a reading that would have to be canceled out prior to the next measurement. Due to the features of coil 66, probe 40 has inherently low hysteresis. The coiling of the core lowers the hysteresis, and the composition of the material and annealing also aid in the process.

As shown in FIGS. 3A and 3B, a Hall generator 72 is mounted in slot 69 so that it is completely sealed in the body of the probe. Hall generator 72 is a four-terminal device having four output conductors or leads 74-77 which are wired to a printed circuit board 79. Hall generator 72 is a square of silicon doped to a predetermined conductivity and deposited on a ceramic wafer. The silicon is quite thin, and contacts are made at four points on the periphery. These four points, in turn, are connected to leads 74-77, respectively.

To operate the Hall generator, a bias current is conducted through leads 74 and 75. The current of a conductor placed inside coil 66 (e.g., conductor 17) produces a magnetic field having a vector normal to the plane of Hall generator 72. A corresponding output voltage proportional to the magnetic field appears across Hall generator outputs 76, 77. The output voltage is proportional to the product of the bias current and the normal components of the magnetic field. If the magnetic field is not normal to the Hall generator, but instead is at some angle theta, then the normal component will be the actual field vector times the cosine of theta. The Hall generator responds only to the normal component. The constant of proportionality takes into account the geometry, the thickness, and the doping of the Hall generator itself, and has a temperature coefficient which is approximately −0.07% per degree Centigrade. Since the Hall generator has a negative temperature coefficient, compensation is provided to make the coefficient as near to zero as possible. It has been discovered that this result can be achieved if a temperature dependent resistor is placed near the Hall generator in the probe. This arrangement is particularly important for vehicle current measuring applications in which the probe temperature may vary drastically from the cabinet temperature. For example, cabinet 102 may be in a hot room and probe 40 may be under the hood of an ice cold vehicle, or vice versa.

Referring to FIGS. 3 and 4B, circuit board 79 holds a 5K potentiometer 80 and a temperature-dependent resistor, such as a thermistor 82. An additional resistor 83 is also mounted on board 79. Probe 40 and cabinet 102 are connected together by a cable 85 comprising conductors 87-91 (FIG. 4B). As described in detail later, the location of potentiometer 80 in probe 40 is an important feature which enables each Hall generator to be individually calibrated so that any probe can be interchangeably used with any circuit system of the type shown in the drawings.

Referring to FIG. 1, cabinet 102 includes a meter 104 having a face 106 calibrated in amperes and a pointer 107. The meter includes a coil of wire (not shown) having a resistance which varies with temperature. Meter 104 is a zero center variety which reads left of center for currents in one direction and right of center for currents in the opposite direction.

The circuitry in system 100 for indicating current flow on meter 104 based on the output voltage produced by Hall generator 72 basically includes a regulator system 120, a current bias system 190, and a readout system 230 Hall generator 72, together with regulator system 120 and current bias system 190, form a Hall system for producing a Hall voltage proportional to the magnitude of a current flowing through conductor 17.

Figure 4A:
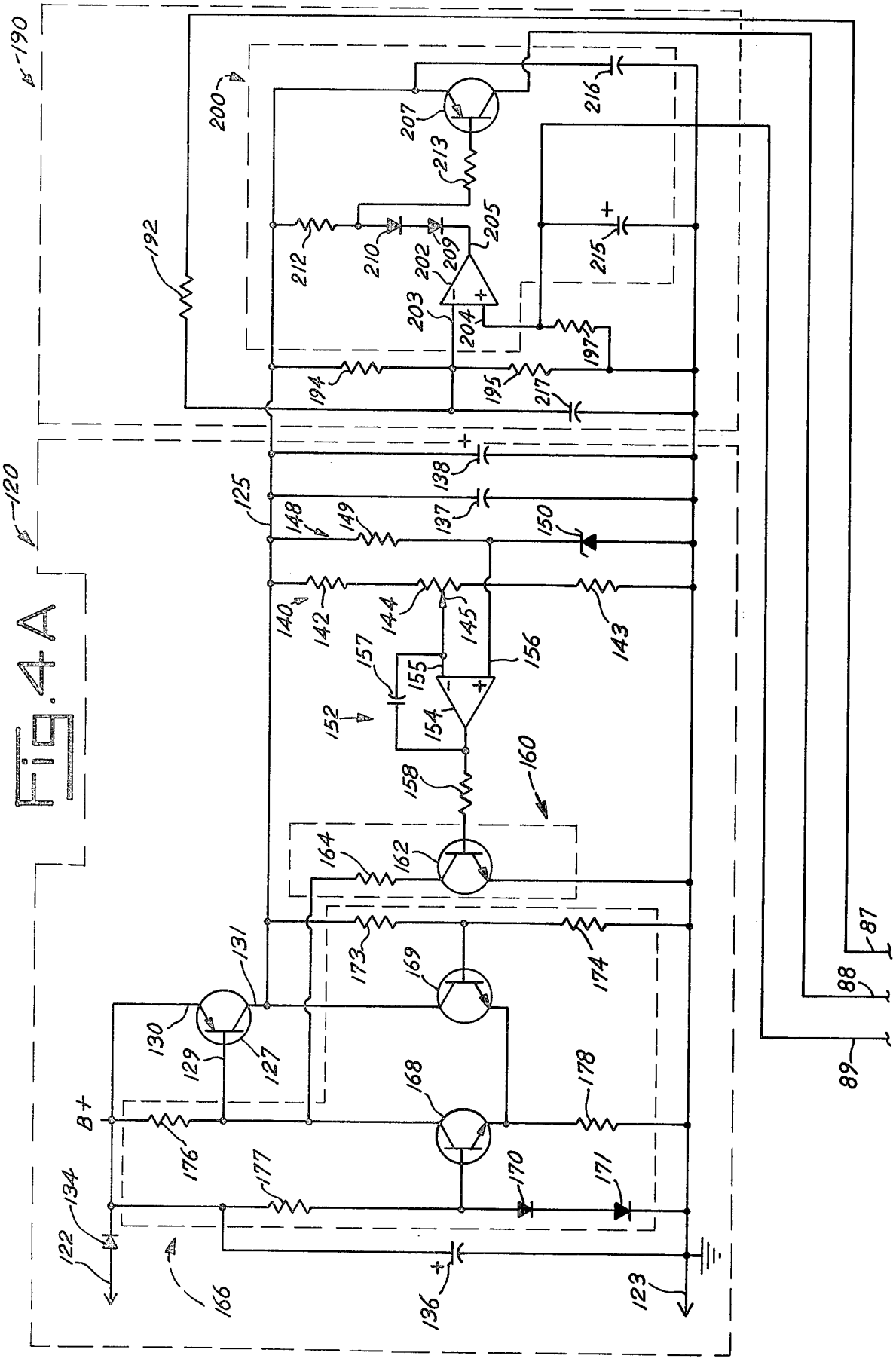

Referring to FIG. 4A, regulator system 120 receives input voltage from battery 12 over input conductors 122 and 123. Conductor 122 is connected to the positive terminal of battery 12, whereas conductor 123 is connected to the negative terminal of battery 12. Conductor 123, thus, becomes a negative power bus or terminal. System 120 utilizes the voltage received from battery 12 in order to produce a regulated voltage on power supply bus or terminal 125.

System 120 includes a series regulating transistor 127 having a base element 129, an emitter element 130, and a collector element 131 connected as shown. Transistor 127 is fitted with an appropriate heat sink in order to dissipate power as heat energy.

Regulator system 120 includes a filter and protection circuit comprising a diode 134 and capacitors 136-138. Diode 134 protects the circuitry in case leads 122, 123 are connected backwards. Capacitor 136 acts as a spike filter to remove spikes that may be present from the battery of the vehicle under test. Capacitors 137, 138 act as filters to insure a low output impedance of the regulator at higher frequencies.

The regulator also includes a sensing circuit 140 comprising resistors 142, 143, and a potentiometer 144 having a slider 145. Circuit 140 samples the voltage maintained on supply bus 125.

Sensing circuit 140 acts in cooperation with a reference circuit 148 including a resistor 149 and an integrated circuit reference diode 150 which produces a 1.22 volt drop. Diode 150 may be implemented by a National Semiconductor Corp. integrated circuit model LM113H.

The sensing and reference circuits provide inputs to a comparator circuit 152 comprising an operational amplifier 154 connected as a difference amplifier. The amplifier includes an inverting input 155, a non-inverting input 156, a feedback capacitor 157 and an output resistor 158 through which a correction signal is transmitted. The correction signal is processed by an amplifier 160 including a transistor 162 and a resistor 164 connected as shown.

Due to the unique configuration of regulating transistor 127, the regulator includes a starting circuit 166 comprising switch transistors 168, 169 and diodes 170, 171. The diodes establish a switching voltage which switches transistor 168 into a conductive state when the regulator is initially connected to a battery. Transistor 169 is operated by sensing resistors 173, 174. The junction between the resistors establishes a sensing voltage proportional to the supply voltage on bus 125. Additional resistors 176–178 are connected as shown.

An important feature of regulator system 120 is its ability to maintain a 3.25 volt regulated supply on bus 125 from a partially discharged 6-volt lead storage battery. Under conditions of heavy load or partial discharge, the battery voltage may be as low as 4.5 volts. It has been discovered that the power drain from the battery and the voltage drop required by regulating transistor 127 both can be reduced to a minimum by using the unique configuration of components shown. According to one feature of the circuit, the emitter of transistor 127 is operatively connected to the positive terminal of the battery, whereas the collector of transistor 127 is operatively connected to the regulated supply bus 125. This arrangement minimizes the voltage drop required by transistor 127 in order to achieve adequate regulation.

When battery 12 is initially connected to regulator system 120, starting circuit 166 causes transistor 127 to begin to conduct current from its emitter 130 to its collector 131. As the voltage on conductor 122 rises, current flows through resistor 177, and a voltage is developed at the base of transistor 168 due to the voltage drop across diode 170, 171. As a result, transistor 168 is switched to its conductive state so that the current is drawn through resistor 176. The flow of current creates a voltage drop across resistor 176, and transistor 127 begins to conduct current from its emitter to collector elements. The base of transistor 168 is clamped to approximately 1.2 volts by the drop across diodes 170, 171. As the collector of transistor 127 rises in voltage, voltage is applied to resistors 173, 174. When the junction of resistors 173, 174 exceeds the 1.2 volt drop across diodes 170, 171, transistor 168 is switched to its non-conductive state, and transistor 169 is switched to its conductive state. In this mode of operation, transistor 169 becomes a load for transistor 127, and the variable collector-emitter impedance of transistor 127 then is adjusted by comparator circuit 152. Inputs 155, 156 of operational amplifier 154 compare the voltages produced by sensing circuit 140 and reference circuit 148. Amplifier 154 produces a correction signal which is amplified by transistor 162, and the output of transistor 162 is applied to the base of transistor 127. The correction signal varies the emitter-collector impedance of transistor 126 to maintain 3.25 volts on supply bus 125.

Another novel feature of this regulator is its ability to operate safely from power supplies with continuous levels as high as +40 volts. If +40 volts is applied to input conductor 122, up to 40 volts will be applied to capacitor 136; resistors 164, 176 and 177; and transistors 127, 162 and 168. These components have been selected to withstand voltages up to +40 volts continuous, and all other components in the circuit are protected since the collector of transistor 127 will remain at +3.25 volts. The current drawn through supply bus 125 will not appreciably increase because transistor 127 is a series regulator, and, after startup is achieved, transistor 168 is switched to its non-conductive state. Transistor 162 conducts only enough current to operate transistor 127 irrespective of the voltage appearing on conductor 122. Thus, the only appreciable current increase is through resistor 177, and the increase is limited to a few milliamperes.

Current bias system 190 includes a reference voltage circuit incorporating potentiometer 80 which is located in probe 40, as well as a 1K resistor 192 located in cabinet 102. The potentiometer acts as a source of adjustable voltage in probe 40 which can initially adjust the bias current flowing through Hall generator inputs 74, 75.

The reference circuit also includes resistors 194, 195 arranged as a voltage divider. Voltage at the junction of resistors 194, 195 combines with the adjustable voltage from potentiometer 80 and resistor 192 to generate a reference voltage. A sensing resistor 197 is connected in series with the Hall generator input terminals 74, 75. Resistor 197 generates a sensing voltage proportional to the current flowing through terminals 74, 75.

A current control circuit 200 utilizes the sensing voltage and reference voltage in order to maintain the current flowing through the Hall generator at a constant value which can be initially adjusted by potentiometer 80. Circuit 200 includes an operational amplifier 202 connected as a difference amplifier having an inverting input 203, a non-inverting input 204 and an output 205. A transistor 207 is connected as an amplifier in order to control the current flowing through the Hall generator 72. Transistor 207 can be considered as part of the difference amplifier incorporating operational amplifier 202. The current control also includes diodes 209, 210, resistors 212, 213 and capacitors 215–217 connected as shown. Resistor 212 insures that transistor 207 will not turn on through its leakage current or through the leakage current of operational amplifier 202.

When the output of operational amplifier 202 decreases toward zero volts, electron current flows through diodes 209, 210 into resistor 213 and the base of transistor 207. As a result, the electron current flowing from emitter to collector of transistor 207 increases in order to increase the bias current flowing through Hall generator 72. If the output of operational amplifier 202 increases toward the 3.25 volt supply, the operation is reversed so that the electron current flowing from emitter to collector of transistor 207 is decreased. This mode of operation can be used in order to maintain the bias current flowing through the Hall generator at a preadjusted level.

The manner in which this operation is achieved can best be explained by assuming that potentiometer 80 is adjusted to its full resistance of 5000 ohms. Then, the reference voltage at the inverting input 203 of operational amplifier 202 is approximately 0.25 volts. The bias current through terminals 74, 75 of Hall generator 72 increases until the voltage across resistor 197 is 0.25 volts, at which time the current is approximately 16.7 milliamperes, the minimum bias current. By the operation previously described, operational amplifier 202 and transistor 207 maintain the bias current at 16.7 milliamperes irrespective of temperature and supply voltage changes.

If the resistance value of potentiometer 80 is decreased, more current is fed back through resistor 192, and the reference voltage at inverting input 203 is increased. As a result, more current flows through leads 74, 75 of Hall generator 72 until the voltage across resistor 197 equals the increased reference voltage. If potentiometer 80 is adjusted to zero ohms, the current through leads 74, 75 of Hall generator 72 is approximately 42 milliamperes, the maximum bias current.

The ability of potentiometer 80, located in probe 40, to adjust the bias current created and regulated by circuit 190 in cabinet 102 is an important feature. It allows each probe to be initially adjusted so that its bias current times its Hall generator coefficient yields a constant output voltage across leads 76, 77. This adjustment is achieved by placing the jaws of the probe around a conductor carrying a known amount of current. Potentiometer 80 is then adjusted until pointer 107 indicates the correct number of amperes on meter face 106. In other words, potentiometer 80 is adjusted so that the output voltage from each Hall generator will be identical for a given number of amperes flowing through a conductor located inside coil 66 of probe 40. The probes adjusted in this manner become interchangeable, and can be attached to any cabinet 102 containing the type of current bias system 190 shown in FIG. 4A. If such an arrangement were not available, the difference in sensitivity in the Hall generators would make it impossible to interchange the probes without completely recalibrating each current bias system. It would be impossible to send a new probe to a user in the field. Instead, an entire cabinet and matched, calibrated probe would need to be dispatched.

Referring to FIG. 4B, readout system 230 conditions the voltage produced across leads 76, 77 of Hall generator 72 in order to drive meter 104. The system includes an operational amplifier 232 having an inverting input 233, a non-inverting input 234 and an output 235. The operational amplifier receives voltage from bus 125 through a positive supply terminal 236 and receives ground potential through a negative supply terminal 237 connected to conductor 123.

Operational amplifier 232 is provided with three different feedback networks depending on the type of readout desired. A first feedback network includes a resistor 238 and a capacitor 239; a second feedback network includes resistors 241, 242 and a capacitor 243; and a third feedback network includes resistors 245, 246, 247 and a capacitor 248 arranged as a filter. Operational amplifier 232 also is associated with resistors 250–255, potentiometers 257–259 and capacitors 261, 262 connected as shown.

Readout system 230 also includes an operational amplifier 266 having an inverting input 267, a non-inverting input 268 and an output 269. Positive voltage is supplied to operational amplifier 266 from supply bus 125 through a positive terminal 270, and ground potential is supplied to the amplifier from conductor 123 through a negative supply terminal 271.

Operational amplifier 266 is connected as a meter drive circuit. In order to achieve this result, meter 104 is connected in a feedback loop of amplifier 266, together with a full wave rectifier 274 comprising diodes 275–278. A resistor 280 is connected from output 269 to ground potential. Resistors 255 and 280 are used to increase the current sinking capability of their respective amplifiers 232 and 266.

The operating functions of readout system 230 are controlled by a switch assembly 282 comprising contacts 284a–284d used in conjunction with the 500 ampere scale on meter face 106, contacts 285a–285d used in conjuction with the 100 ampere scale on meter face 106 and contacts 286a–286d used in conjunction with the diode stator scale on meter face 106. The contacts are selected by ganged slides 290a–290d which are operated in synchronism by test selector knob 292 (FIG. 1).

Assuming the current to be measured is from about 100–500 amperes, knob 292 and slides 290a–290d are moved to the positions shown in FIGS. 1 and 4B. In these positions, the contacts of switch assembly 282 interconnect the circuit components in the manner shown in FIG. 5. As previously discussed, thermistor 82 is located inside probe 40 in order to compensate for the decrease in voltage from Hall generator 72 as the temperature rises. As shown in FIG. 5, lead 76 of Hall generator 72 becomes the reference point for the readout system which floats with respect to the electrical power furnished by bus 125 and ground conductor 123. This is an important feature which gives the readout system common mode rejection of like changes in voltage on leads 76, 77 of Hall generator 72. In other words, the reading of meter 104 does not change substantially if leads 76 and 77 increase or decrease simultaneously in voltage to the same extent.

As shown in FIG. 5, operational amplifier 232 amplifies the voltage produced across leads 76, 77 of Hall generator 72. The gain of the amplifier is approximately equal to the value of feedback resistor 238 divided by the equivalent resistance of thermistor 82 and resistors 83, 252. Typically a gain of 15 to 16 is provided. Capacitor 239 (FIG. 4B) reduces the frequency response, and thereby reduces the noise level. The output of amplifier 232 drives operational amplifier 266 which is connected as a meter driver. The overall gain of the readout system can be adjusted by means of potentiometer 259.

The placement of meter 104 in the feedback circuit of driver amplifier 266 is an important feature which enables the meter to be accurately driven irrespective of changes in meter coil resistance due to temperature variations. When the meter 104 is placed in the feedback circuit, the current flowing through the meter equals the input current flowing into inverting input 267. This current is the Hall output voltage across terminals 76, 77 times the gain of the amplifier 232 stage divided by the sum of the values of potentiometer 259 and resistor 254. At full scale, the current flowing through meter 104 is about 0.5 milliamperes.

Another important feature of the readout system is that amplifiers 232 and 266 "float" with respect to the DC power supplied by bus 125 and conductor 123. As shown in FIG. 4B, the supply voltage is effectively isolated from the inputs and outputs of amplifiers 232 and 266 by the arrangement of the components. This feature substantially improves the common mode rejection of the readout system. In other words, when the voltages on terminals 76 and 77 change simultaneously by substantially the same values, the reading on meter 104 remains substantially unchanged. This feature, of course, increases the accuracy and reliability of the current measurement.

The circuitry of FIG. 5 uses the voltage produced by the Hall generator in order to indicate on meter 104 the magnitude of the direct current flowing through conductor 17.

When knob 292 is moved to the 100 position (FIG. 1) so that slides 290a–290d touch contacts 285a–285d, the DC current flowing through conductor 17 is measured in the same manner described above, except that the gain of amplifier 232 is changed by altering the resistance value of the feedback loop in order to measure currents in the 0–100 ampere range.

Before beginning any test, meter 104 should be zeroed by operating potentiometers 257 and 258 (FIG. 4B). Potentiometer 258 is a sensitivity adjustment device for potentiometer 257 which is connected across leads 74, 75 of Hall generator 72. Potentiometer 257 places a slightly unbalanced resistor network across one side of Hall generator 72 which compensates for the zero offset of the generator. The zero offset is inherent in the device due to the impossibility of manufacturing a perfectly symmetrical generator. Potentiometer 257 is adjusted by a zero knob 294 (FIG. 1) to correct for any small imbalance in the Hall generator, thus causing the meter current to be zero when there are zero amperes flowing in conductor 17.

By moving knob 292 to the ALT position (FIG. 1) so that slides 290a–290d touch contacts 286a–286d, respectively, the components shown in FIG. 6 are connected together. These components are used in order to detect defective diodes or windings in alternator 23 (FIG. 2) by measuring the fluctuating current flowing through conductor 17 or 21. The test can be conducted without disconnecting or alterating in any way the circuit connections of the vehicle incorporating alternator 23. Thus, the test can be conducted under actual operating conditions. This is an important advantage over prior alternator testers which have required the insertion of test components into the vehicle charging system. One such prior system is shown in U.S. Pat. No. 3,594,642 (Wright-July 20, 1971).

A properly operating alternator will produce a smooth, three-phase rectified current flow, with very little ripple component. An alternator with a shorted or open diode or an open stator winding or partially shorted stator winding will produce a much higher ripple content. The circuitry shown in FIG. 6 detects the increased ripple or fluctuating component of current produced by alternator 23, and displays it on meter 104. If pointer 107 indicates a ripple or fluctuating current component greater than R (FIG. 1) on meter 104, a defective alternator is indicated.

As shown in FIG. 6, the feedback network for amplifier 232 is changed to a T-network which maintains a reasonbly low value of DC gain, but very high AC gain. The AC gain is frequency dependent and is determined by the values of resistors 245–247 and capacitor 248. Another such circuit is formed by resistors 251, 252 and capacitors 261, 262. Due to these circuits, the gain of amplifier 232 rolls off or is attenuated at a high rate below approximately 200 Hertz. Likewise, the gain of amplifier 232 begins to roll off or attenuate at frequencies greater than approximately 2500 Hertz due to the roll off characteristic of the amplifier itself. Due to the DC blocking effect of capacitor 262, the components shown in FIG. 6 form a frequency-shaping circuit which passes only fluctuating signals, and which provides peak gain at approximately 1 K Hertz. The frequency characteristics of the FIG. 6 circuitry rejects the thin, evenly-spaced ripple spikes present in a properly functioning three-phase alternator, and rejects the low frequency hunting caused by the action of regulator 26 in its effort to stabilize the battery voltage. However, the circuit amplifies the fluctuating components of current due to defects in the alternator. As a result, a substantial meter current greater than value R flows in meter 104 in reponse to any such defect.

In order to measure the DC current flowing through conductor 17 of the vehicle charging system shown in FIG. 2, probe 40 is zeroed in the manner described above. The jaws of probe 40 are opened and placed around conductor 17. The jaws then are closed so that conductor 17 is positioned in the manner shown in FIG. 1. Conductor 122 is connected to battery terminal 13 and conductor 123 is connected to battery terminal 14. No part of the vehicle charging system needs to be disconnected.

Knob 292 then is moved to the "500" or "100" position (FIG. 1), and the DC current flowing through conductor 17 is accurately shown on meter face 104. The system continues to operate accurately as long as battery 12 can maintain about 4.5 volts across terminals 13 and 14. Of course, the system can be used while the engine of the vehicle is stopped, cranking or running.

In order to test alternator 23, the alternator is driven by the engine and knob 292 is moved to the ALT position (FIG. 1). The connections to the vehicle described above remain the same. If pointer 107 moves to the right of the R mark, the alternator is defective.

Those skilled in the art will recognize that only a single embodiment of the present invention has been illustrated, and that the embodiment may be modified and altered without departing from the true spirit and scope of the invention as defined by the accompanying claims.

We claim:

1. Apparatus for determining the magnitude of a current to be measured flowing through a conductor, said apparatus comprising:
   a probe adapted to be coupled to the conductor;
   a cabinet;
   a Hall generator located in the probe, said Hall generator including first and second Hall inputs for receiving a bias current and first and second Hall outputs for producing a Hall voltage proportional to the current to be measured;
   current control means located in the cabinet for controlling the bias current;
   utilization means located in the cabinet for utilizing the Hall voltage;
   adjustment means located in the probe for enabling the current control means to generate a predetermined value of bias current, so that the Hall voltage is calibrated; and
   cable means for electrically interconnecting the adjustment means to the current control means and for conducting the bias current and Hall voltage between the cabinet and probe, whereby each probe can be individually adjusted by the adjustment means to be interchangeably connected to a variety of cabinets through the cable means.

2. Apparatus, as claimed in claim 1, wherein the current control means comprises:
   reference means for generating a reference voltage;
   sample means for generating a sample voltage proportional to the magnitude of the current flowing through the Hall generator; and
   means for adjusting the bias current flowing from the first to second Hall inputs until the reference voltage and sample voltage attain a predetermined relationship, whereby the bias current is maintained constant; and wherein the utilization means comprises readout means for indicating the magnitude of the measured current by determining the magnitude of the Hall voltage.

3. Apparatus, as claimed in claim 2, wherein the adjustment means comprises a source of adjustable voltage located in the probe; and wherein the reference means comprises means for combining the adjustable voltage with a predetermined voltage level to form the reference voltage.

4. Apparatus, as claimed in claim 3, wherein the source of adjustable voltage comprises a potentiometer connected to the first Hall input.

5. Apparatus, as claimed in claim 4, wherein the means for combining comprises a voltage divider including at least first and second divider resistors connected by a junction attached to the potentiometer.

6. Apparatus, as claimed in claim 5, wherein the sensing means comprises a series resistor connected in series with the first and second Hall inputs.

7. Apparatus, as claimed in claim 6, wherein the current control means comprises:
a difference amplifier including a first amp input, a second amp input and an amp output;
means for connecting the junction of the first and second divider resistors to the first amp input;
means for connecting the series resistor to the second amp input; and
means for connecting the amp output to one of the first and second Hall inputs.

8. Apparatus, as claimed in claim 2, wherein the readout means comprises:
power supply means for generating a DC voltage between a first power terminal and a second power terminal;
first operational amplifier means including a first inverting input, a first non-inverting input, a first output, a first positive supply terminal, a first negative supply terminal, and a feedback loop;
first connection means for operatively connecting the first power terminal to the first positive supply terminal;
second connection means for operatively connecting the second power terminal to the first negative supply terminal;
means for coupling an input voltage proportional to the Hall voltage across the first inverting input and the first non-inverting input;
a meter responsive to current including a coil having an impedance;
third connection means for connecting the meter in the feedback loop; and
means for isolating the power supply means from the first inverting input, first non-inverting input and first output, whereby the reading of the meter remains substantially constant irrespective of like changes in voltage on the first and second Hall outputs and irrespective of changes in the impedance of the meter.

9. Apparatus, as claimed in claim 8, wherein the means for coupling comprises a temperature dependent resistor located in the probe.

10. Apparatus, as claimed in claim 8, wherein the means for coupling comprises:
second operational amplifier means including a second inverting input, a second non-inverting input, a second output, a second positive supply terminal, and a second negative supply terminal;
fourth connection means for operatively connecting the first power terminal to the second positive supply terminal;
fifth connection means for operatively connecting the second power terminal to the second negative supply terminal;
sixth connection means for operatively connecting the first Hall output to the second inverting input and for operatively connecting the second Hall output to the first and second non-inverting inputs;
seventh connection means for operatively connecting the second output to the first inverting input; and
second means for isolating the power supply means from the second inverting input, second non-inverting input and second output.

11. Apparatus, as claimed in claim 8, wherein the feedback loop is connected between the first inverting input and the first output.

12. Apparatus, as claimed in claim 2, wherein the readout means comprises:
amplifier means for amplifying the fluctuating components of the Hall voltage;
rectifier means for converting the amplified Hall voltage to a corresponding DC signal; and
meter means for indicating the magnitude of the DC signal, whereby defects in a vehicular alternator can be detected.

13. Apparatus, as claimed in claim 12, and further comprising filter means for attenuating the fluctuating components of the Hall voltage below a first predetermined frequency.

14. Apparatus, as claimed in claim 13, wherein the first predetermined frequency is about 200 Hertz.

15. Apparatus, as claimed in claim 1, wherein the probe further comprises a toroidal, laminated core having an inner diameter sufficiently large to receive the conductor and having a radial slot in which the Hall generator is located, said core comprising nickel and iron.

16. Apparatus, as claimed in claim 15, wherein the core is cut in half to allow the insertion of the conductor into the inside of the toroidal core.

17. Apparatus, as claimed in claim 16, wherein the core is annealed to reduce hysteresis.

18. Apparatus, as claimed in claim 17, wherein the core comprises at least 35 percent nickel.

19. Apparatus, as claimed in claim 17, wherein the core comprises nickel, molybdenum and iron.

20. Apparatus, as claimed in claim 19, wherein the core comprises over 60 percent nickel, over 10 percent molybdenum and the balance iron.

21. Apparatus, as claimed in claim 18, wherein the core comprises a hollow, cylindrical, coiled strip of metal having an insulating adhesive positioned between the convolutions of the coil.

22. In a system for determining the magnitude of a current to be measured flowing through a conductor by use of a Hall generator including first and second Hall inputs for receiving a bias current and including first and second Hall outputs for producing a Hall voltage proportional to the current to be measured, improved apparatus for reading out the Hall voltage comprising:
power supply means for generating a DC voltage between a first power terminal and a second power terminal;

current control means for enabling a controlled amount of bias current to be conducted from the first power terminal through the first and second Hall inputs to the second power terminal;

first operational amplifier means including a first inverting input, a first non-inverting input, a first output, a first positive supply terminal, a first negative supply terminal, and a feedback loop;

first connection means for operatively connecting the first power terminal to the first positive supply terminal;

second connection means for operatively connecting the second power terminal to the first negative supply terminal;

means for coupling an input voltage proportional to the Hall voltage across the first inverting input and the first non-inverting input;

a meter responsive to current including a coil having an impedance;

third connection means for connecting the meter in the feedback loop; and means for resistively coupling the power supply means to the first inverting input, first non-inverting input and first output, whereby the reading of the meter remains substantially constant irrespective of like changes in voltage on the first and second Hall outputs and irrespective of changes in the impedance of the meter.

23. Apparatus, as claimed in claim 22, wherein the means for coupling comprises a temperature dependent resistor.

24. Apparatus, as claimed in claim 22, wherein the means for coupling comprises:

second operational amplifier means including a second inverting input, a second non-inverting input, a second output, a second positive supply terminal, and a second negative supply terminal;

fourth connection means for operatively connecting the first power terminal to the second positive supply terminal;

fifth connection means for operatively connecting the second power terminal to the second negative supply terminal;

sixth connection means for operatively connecting the first Hall output to the second inverting input and for operatively connecting the second Hall output to the first and second non-inverting inputs;

seventh connection means for operatively connecting the second output to the first inverting input; and second means for isolating the power supply means from the second inverting input, second non-inverting input and second output.

25. Apparatus, as claimed in claim 22, wherein the feedback loop is connected between the first inverting input and the first output.

* * * * *